(12) United States Patent
Sugiyama et al.

(10) Patent No.: US 6,281,519 B1
(45) Date of Patent: Aug. 28, 2001

(54) QUANTUM SEMICONDUCTOR MEMORY DEVICE INCLUDING QUANTUM DOTS

(75) Inventors: Yoshihiro Sugiyama; Yoshiaki Nakata, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/273,526

(22) Filed: Mar. 22, 1999

Related U.S. Application Data

(63) Continuation-in-part of application No. 09/019,104, filed on Feb. 5, 1998, now abandoned.

(30) Foreign Application Priority Data

Aug. 13, 1997 (JP) .................................................... 9-218650
Jul. 30, 1998 (JP) .................................................. 10-215968

(51) Int. Cl.$^7$ ................................................ H01L 29/06
(52) U.S. Cl. .............................. 257/14; 257/18; 257/21; 257/184; 257/460; 257/615
(58) Field of Search ................................. 257/14, 15, 18, 257/21, 184, 201, 460, 615

(56) References Cited

U.S. PATENT DOCUMENTS

| | | |
|---|---|---|
| 4,581,621 | 4/1986 | Reed . |
| 5,671,437 | 9/1997 | Taira . |
| 5,710,436 | 1/1998 | Tanamoto et al. . |
| 5,936,258 * | 8/1999 | Imamura et al. ...................... 257/21 |

OTHER PUBLICATIONS

S. Fafard et al., Appl. Phys, Lett.68(7), pp. 991–993, Feb. 12, 1996.
Kohki Mukai et al, Jpn. J. Appl. Phys. vol. 33, Part 2, No. 12A, pp. L1710–1712, Dec. 1, 1994.
D. Leonard et al, Appl. Phys lett. 63(23), pp.3203–3205, Dec. 6, 1993.
Shunichi Muto, Jpn. J. Appl. Phys. vol. 34, Part 2, No. 2B, pp. L210–L212, Feb. 15, 1995.
R. Leon et al, Appl. Phys. Lett. 67(4), pp. 521–523, Jul. 24, 1995.
A. Kurtenbach et al, Appl. Phys. Lett. 66(3), pp. 361–363, Jan. 16, 1995.
J. Oshinowo et al, Appl. Phys Lett. 65(11), pp. 1421–1423, Sept. 12, 1994.

* cited by examiner

*Primary Examiner*—Sara Crane
(74) *Attorney, Agent, or Firm*—Armstrong, Westerman, Hattori, McLeland & Naughton

(57) ABSTRACT

A quantum semiconductor memory device includes a quantum structure formed on a substrate, wherein the quantum structure includes a plurality of self-organized quantum dots forming a strained heteroepitaxial system with respect to the substrate and an accumulation layer formed adjacent to the self-organized quantum dots, and wherein the self-organized quantum dots are formed of a semiconductor crystal having a composition set such that quantum levels of the self-organized quantum dots are located higher than a conduction band of the accumulation layer.

20 Claims, 15 Drawing Sheets

— 50nm

QUANTUM SEMICONDUCTOR MEMORY DEVICE INCLUDING QUANTUM DOTS

CROSS-REFERENCE TO RELATED APPLICATIONS

The present invention is a continuation-in-part application of the U.S. patent application Ser. No. 09/019,104 filed Feb. 5, 1998, the disclosure content thereof being incorporated herein by reference.

BACKGROUND OF THE INVENTION

The present invention generally relates to quantum semiconductor devices and more particularly to a quantum semiconductor memory device that uses a quantum dot structure for storage of information and a fabrication process thereof.

In a so-called bulk semiconductor crystal in which there is no carrier confinement, the state density of carriers increases continuously along a parabolic curve with energy. In a so-called quantum well structure in which the carriers are confined one-dimensionally in a two-dimensional plane, on the other hand, there appears a stepwise change in the state density with energy due to the existence of quantum states. In such a system that has a stepwise change in the state density, the distribution of carriers is restricted substantially as compared with the case of a bulk crystal, and a sharp optical spectrum is obtained when the quantum well structure is used for an optical semiconductor device such as a laser diode. By using a quantum well structure, the efficiency of optical emission is improved in such optical semiconductor devices. Further, quantum well structures are used for an energy filter of carriers in electron devices that have a resonant-tunneling barrier such as an RHET (resonant-tunneling heterostructure transistor).

In a quantum wire structure in which the degree of carrier confinement is increased further, the state density of the carriers is modified such that there appears a maximum state density at the bottom edge of each step. Thereby, the sharpness of the energy spectrum increases further.

In an ultimate quantum dot structure in which the degree of carrier confinement is increased further, the state density becomes discrete as a result of the three-dimensional carrier confinement, and the energy spectrum of the carriers becomes also discrete in correspondence to the discrete quantum levels. In the system that has such a discrete energy spectrum, the transition of carriers occurs discontinuously between the quantum levels even at a room temperature in which there exists a substantial thermal excitation. Thus, an optical semiconductor device that uses a quantum dot structure can provide a very sharp optical spectrum even in a room temperature operation.

Further, the energy filter having a quantum dot structure can provide the desired very sharp energy spectrum not only at a very low temperature but also at a room temperature.

Meanwhile, there is a proposal to construct a quantum semiconductor memory device that uses such a quantum dot structure for an optical storage of information. For example, Muto, et al. (Muto, S. Jpn. J. Appl. Phys. vol.34, 1995, pp.L210–212, Part2, No.2B, February 1995) describes a quantum semiconductor memory device that uses a quantum dot structure formed on a stepped semiconductor surface by a lateral epitaxial growth of semiconductor layers. In the proposed structure, the electrons excited as a result of an optical excitation are caused to tunnel to an adjacent semiconductor layer and held therein.

In the foregoing quantum structure, the electron excited in the quantum dot is held stably in the semiconductor layer adjacent to the quantum dot in a spatially separated state from the hole that is created as a result of the optical excitation of the electron and remaining in the quantum dot. By forming the quantum dot from a semiconductor material of a direct-transition type and by forming the adjacent semiconductor layer from a semiconductor material of an indirect-transition type, the optical excitation of carriers in the adjacent semiconductor layer is effectively avoided.

FIG. 1 is a band diagram showing the principle of the conventional quantum semiconductor memory device of the foregoing prior art.

Referring to FIG. 1, the quantum semiconductor memory device includes a quantum dot M1 of GaAs surrounded by a storage layer M3 of AlAs, with a thin barrier layer M2 of AlGaAs intervening between the quantum dot M1 and the storage layer M3. It should be noted that GaAs forming the quantum dot M1 is a typical direct-transition type semiconductor material and causes an excitation of an electron represented by a solid circle to a quantum level $L_e$ and a hole represented by an open circle to a quantum level $L_h$ in response to an irradiation of an optical radiation having a wavelength v.

Thereby, it should be noted that the quantum dot M1 has a size set such that the quantum level $L_e$ is located higher than a bottom edge of the conduction band of the adjacent AlAs layer M3, so that the electron thus excited in the quantum dot M1 can fall to the conduction band of the AlAs layer M3, after passing through the barrier layer M2 by tunneling. On the other hand, the hole that is created in the quantum dot M1 as a result of the optical excitation of the electron remains in the quantum dot M1 because of the larger effective mass. Thereby, the electron and hole thus excited optically are held stably at respective locations separated from each other spatially.

In the band structure of FIG. 1, it should be noted that the optical excitation in the AlAs layer M3 does not occur substantially. In the AlAs layer M3, which is an indirect-transition type semiconductor, the optical excitation of carriers from the valence band to the X-valley of the conduction band occurs only in the presence of the other elementary excitation such as a phonon that satisfies the conservation of momentum. Further, the excitation to the Γ-valley, which does not require such an interaction with other elementary excitations, does not occur because of the very large transition energy necessary for causing the optical excitation. Thus, there occurs no substantial optical excitation in the AlAs layer M3.

In order to fabricate the quantum semiconductor memory device having such a quantum dot structure, it is necessary to establish a technology to form a high-quality quantum dot with clearly defined quantum levels so that the desired optical transition of carriers occurs between these quantum levels. In addition, it is necessary that the size of the quantum dot is controlled in the quantum semiconductor memory device of FIG. 1 such that the quantum level $L_e$ in the quantum dot M1 is located at an energetically higher level than the X-valley of the conduction band of the AlAs layer M3.

Conventionally, the so-called quantum well structure that confines the carries in a substantially two-dimensional surface has been formed successfully and with reliability by using an MBE (molecular beam epitaxy) process or an MOVPE (metal-organic vapor phase epitaxy) process, such that a very thin quantum layer is sandwiched by a pair of barrier layers. Further, a quantum wire structure, in which the carriers are confined substantially along a one-dimensional wire, can be formed by using a so-called inclined semiconductor substrate having a stepped structure on a principal surface thereof. It is known that a quantum wire can be formed by causing a lateral epitaxial growth of a narrow quantum semiconductor layer having a small thickness and a limited width from each lateral edge of the stepped structure along the stepped surface. Alternatively, a quantum wire may be formed by applying an electron beam lithography.

Thus, it has been thought that a quantum dot structure may also be formed by using a stepped surface of an inclined semiconductor substrate or kink similarly to the case of forming a quantum wire. It turned out, however, that it is difficult to control the stepped surface of the inclined semiconductor substrate such that the desired formation of the isolated quantum dot is formed according to such a lateral epitaxial process. Further, the tendency that a mixing of element occurs at the heteroepitaxial interface of the quantum dot thus formed according to such a lateral epitaxial process makes it difficult to form a clearly defined quantum dot having a boundary where there is a sharp change of composition.

Further, the process of forming a quantum dot by using a photolithographic process is not successful due to the substantial damages caused in the quantum dot as a result of the patterning process.

Because of the reasons noted above, the foregoing prior art quantum semiconductor device is not realized yet.

On the other hand, there has been a discovery that a quantum dot can be formed easily by using a so-called S-K (Stranski-Krastanow) growth mode that occurs in a strained heteroepitaxial system such as an InAs/GaAs heteroepitaxial structure at the initial period of heteroepitaxial growth. In an S-K growth mode, quantum dots are formed in the form of discrete islands on a substrate. For example, it is reported that an MBE growth of an InGaAs layer having an In-content of 0.5 on a GaAs substrate with a thickness of several molecular layers, results in a formation of islands of InGaAs each having a diameter of 30–40 nm on the GaAs substrate (Leonard, D., et al., Appl. Phys. Lett. 63, pp.3203–3205, 1993). Further, it is reported that islands of InGaAs having a diameter of 15–20 nm are formed on a GaAs substrate by an ALE (Atomic Layer Epitaxy) process with a mutual distance of about 100 nm (Mukai, K., et al., Jpn. J. Appl. Phys., 33, pp.L1710–L1712, 1994). Further, a similar quantum dot can be formed also by a MOVPE process (Oshinowo, J. et al., Appl. Phys. Lett. 65,(11), pp.1421–1423, 1994).

FIGS. 2A and 2B show an example of such a self-organized quantum dot formed in a strained heteroepitaxial system respectively in a cross sectional view and in a plan view.

Referring to FIG. 2A, a GaAs substrate 1 carries thereon a buffer layer 2 of AlGaAs, and another GaAs layer 3 is formed on the buffer layer 2 epitaxially. The GaAs layer 3 in turn carries thereon a quantum well layer 4 of InGaAs, wherein it should be noted that InGaAs forming the quantum well layer 4 has a lattice constant substantially larger than a lattice constant of GaAs forming the underlying layer 3. Thus, the quantum well layer 4 causes an island growth on the layer 3 as indicated in FIG. 2B, and a number of mutually isolated self-organized quantum dots of InGaAs, each having a height of several nanometers and a diameter of several tens of nanometers, are formed on the GaAs layer 3 spontaneously. By depositing a GaAs barrier layer 5 having a bandgap larger than the bandgap of InGaAs on the InGaAs quantum dot thus formed, discrete quantum levels are formed in the self-organized quantum dot.

As the formation of a self-organized quantum dot in such a strained heteroepitaxial system is controlled by a strain energy formed at the heteroepitaxial interface, the formation of the quantum dot is substantially simplified as compared with the conventional process discussed previously. Further, the formation of a quantum dot on a strained heteroepitaxial system does not require a patterning process and is inherently free from damages. There is already a report claiming successful observation of a photoluminescence (PL) (Leonard, D., et al., op. cit.), in which it is reported that a broad PL peak is confirmed in the vicinity of 1.2 eV with a substantial intensity.

In the quantum dots formed by the S-K growth mode, however, the observed PL peak, although having a substantial intensity, spreads or diffuses substantially. For example, the half-height width FWHM (Full Width at Half Maximum) of the PL peak spreads over a range of 80–100 meV, probably due to the poor control of the size of the individual quantum dots. Recently, Farad et al., (Farad. S., Appl. Phys. Lett., 68(7), pp.991–993, Feb. 12, 1996) has reported a successful observation of a PL wavelength in the 1.5 $\mu$m-band for an S-K mode quantum dot of InAs formed on an AlInAs buffer layer, which in turn is provided on an InP substrate with a lattice matching therewith. In this case, however, the value of FWHM for the observed PL spectrum exceeds 110 meV, indicating that there still remains a substantial problem in the size control of the individual quantum dots.

On the other hand, the existence of such a variation in the size of the quantum dots and hence the wavelength of the optical radiation interacting with the quantum dots, is advantageous for constructing a quantum semiconductor device. In such a quantum semiconductor memory device, it is possible to write different information into the same region of a recording medium, in which the quantum dots are formed, by changing the wavelength of the optical beam used for recording the information. In other words, an optical semiconductor memory device that records information in a wavelength multiplex mode is obtained easily and simply, by using the self-organized quantum dots formed by the S-K growth mode.

In such an optical semiconductor memory device that uses the self-organized quantum dot structure formed by the S-K growth mode, the size of the individual quantum dot is not controlled by the designer of the device as noted already. The size of the quantum dot is roughly determined by the materials used for the substrate and the quantum dot or the deposition temperature. Thus, it has not been possible to control the quantum level $L_e$ of the quantum dot M1 such that the quantum level $L_e$ is located above the X-valley of the conduction band of the adjacent AlAs layer M3, contrary to the case of FIG. 1. Thus, it has not been obvious at all that the desired writing, holding or reading of information is possible when the self-organized quantum dot is applied directly to the quantum semiconductor memory device of FIG. 1.

SUMMARY OF THE INVENTION

Accordingly, it is a general object of the present invention to provide a novel and useful quantum semiconductor memory device wherein the foregoing problems are eliminated.

Another and more specific object of the present invention is to provide a quantum semiconductor device having a self-organized quantum dot and an adjacent semiconductor layer of an indirect-transition type for capturing carriers excited optically in the self-organized quantum dot, wherein the capturing of the optically excited carriers by the adjacent semiconductor layer occurs positively and swiftly.

Another object of the present invention is to provide a quantum semiconductor device, comprising:

a semiconductor substrate;

an active layer formed on said semiconductor substrate, said active layer including a quantum structure; and an accumulation layer provided on said semiconductor substrate adjacent to said active layer;

said quantum structure including: a barrier layer of a first semiconductor crystal having a first lattice constant and a first bandgap; and a plurality of self-organized quantum dots each formed of a second semiconductor crystal having a second lattice constant different from said first lattice constant and a second bandgap smaller than said first bandgap, said second semiconductor crystal forming a strained heteroepitaxial system to said first semiconductor crystal, said plurality of self-organized quantum dots having respective quantum levels;

said second semiconductor crystal having a composition set such that said quantum levels of said self-organized quantum dots are located higher than a conduction band of said accumulation layer.

According to the present invention, optically excited electrons are transferred spontaneously and swiftly to the accumulation layer, without applying an external electric field, in spite of the use of the self-organized quantum dots in the active layer. As noted already, the control of the quantum level is difficult in the self-aligned quantum dot. As the excited electron is held in the accumulation layer with a separation from the corresponding hole remaining in the quantum dot, the loss of information as a result of the recombination of the electron and the hole is prevented substantially.

Another object of the present invention is to provide a quantum semiconductor memory device, comprising:

a semiconductor substrate;

an active layer formed on said semiconductor substrate, said active layer including a quantum structure;

an accumulation layer provided on said semiconductor substrate adjacent to said active layer;

said quantum structure including: a barrier layer of a first semiconductor crystal having a first lattice constant and a first bandgap; and a plurality of self-organized quantum dots each formed of a second semiconductor crystal having a second lattice constant different from said first lattice constant and a second bandgap smaller than said first bandgap, said second semiconductor crystal forming a strained heteroepitaxial system to said first semiconductor crystal, said plurality of self-organized quantum dots having respective quantum levels;

a first optical source emitting a first optical beam with a first wavelength set so as to cause a resonant excitation of an electron in said self-organized quantum dot from a ground quantum level for holes to a ground quantum level for electrons; and a second optical source for emitting a second optical beam with a second wavelength set so as to excite an electron in said ground quantum level for electrons to an energy level exceeding a top edge of a conduction band of said barrier layer.

According to the present invention, it becomes possible to cause an efficient dissipation of the electrons, which have been optically excited in the self-organized quantum dot, to the accumulation layer, in any of the cases in which the quantum level of the electrons in the quantum dot is higher than the corresponding quantum level of the electrons in the accumulation layer and in which the quantum level of the electrons in the quantum dot is lower than the corresponding quantum level of the electrons in the accumulation layer.

Other objects and further features of the present invention will become apparent from the following detailed description when read in conjunction with the attached drawings.

BRIEF DESCRIPTION OF THE PREFERRED EMBODIMENTS

[Principle]

Figure 3:
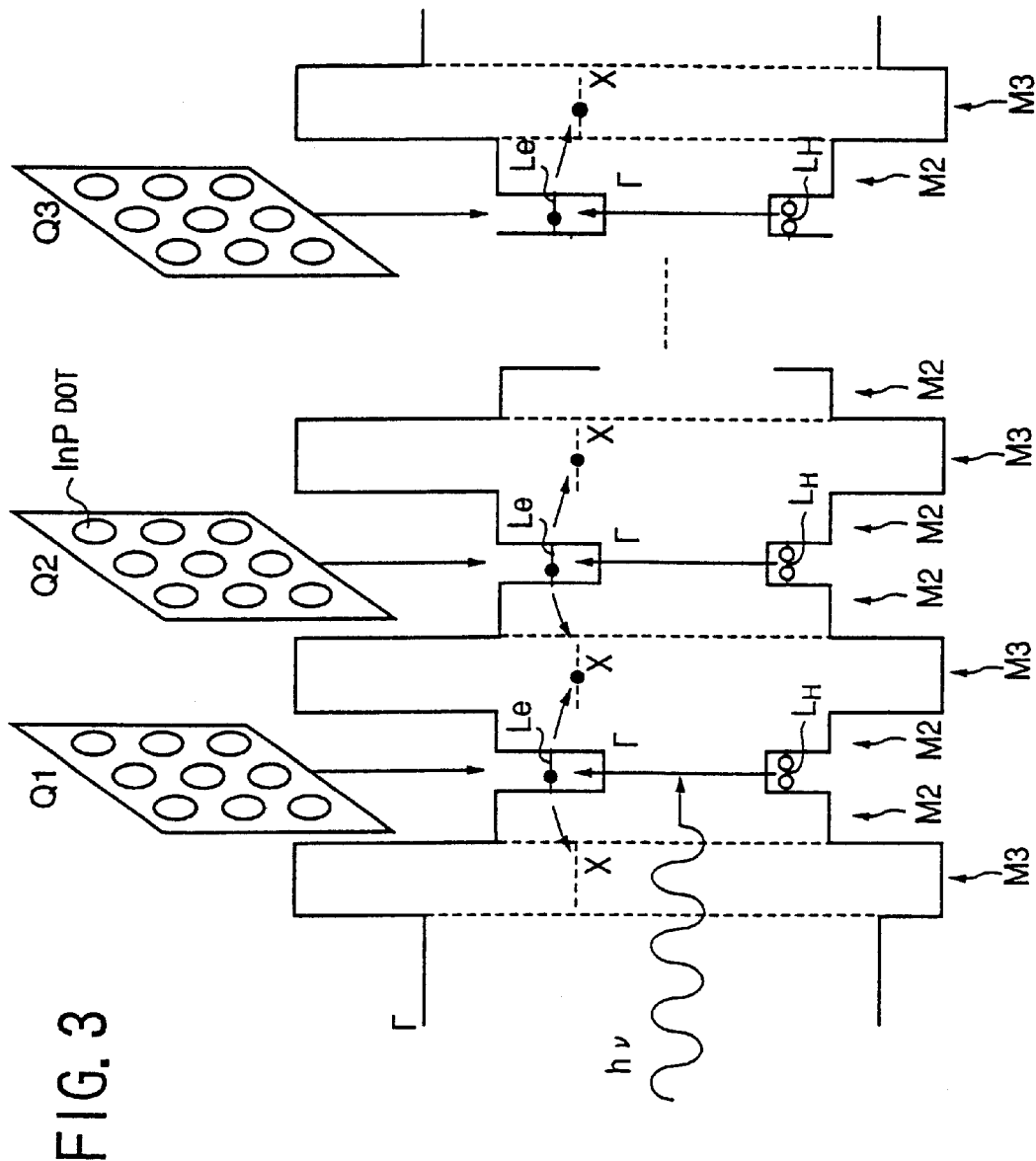
FIG. 3 is a band diagram showing the v principle of. the present invention.

FIG. 3 is a band diagram showing the principle of the present invention.

Figure 1:
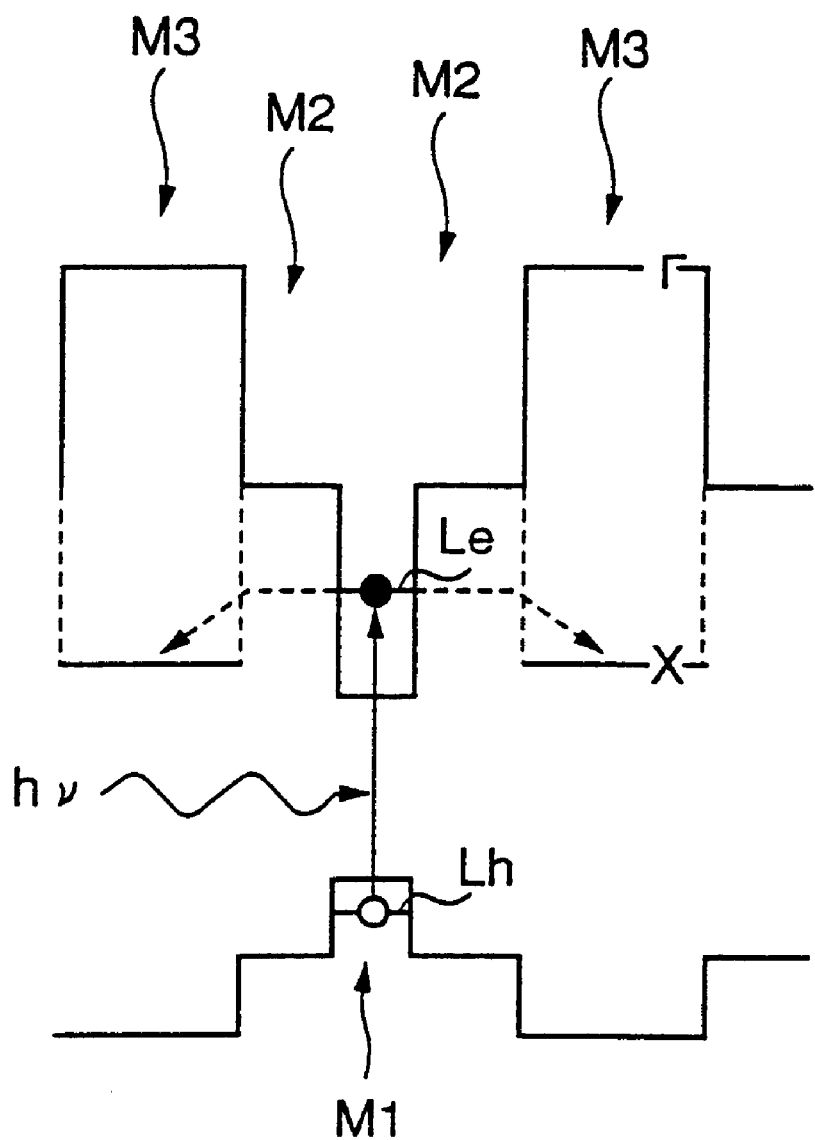
FIG. 1 is a band diagram showing a band structure of a conventional quantum semiconductor memory device.
Figure 2A:
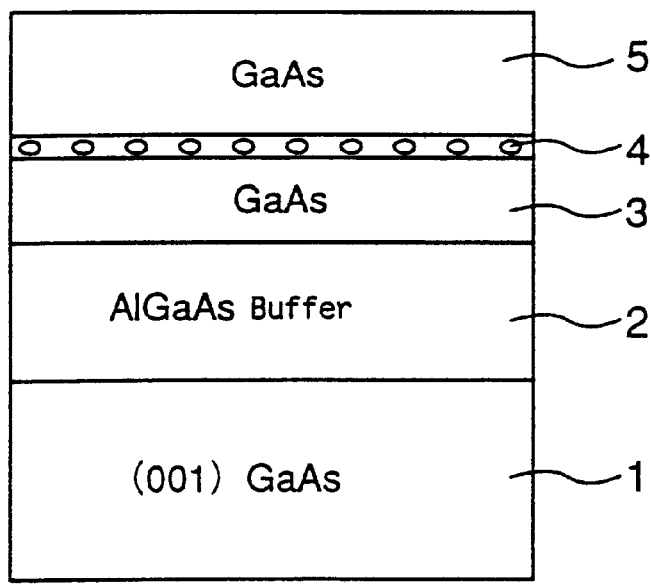
FIGS. 2A and 2B are diagrams showing the construction of a conventional self-organized quantum dot structure respectively in a cross-sectional view and in a plan view.
Figure 2B:
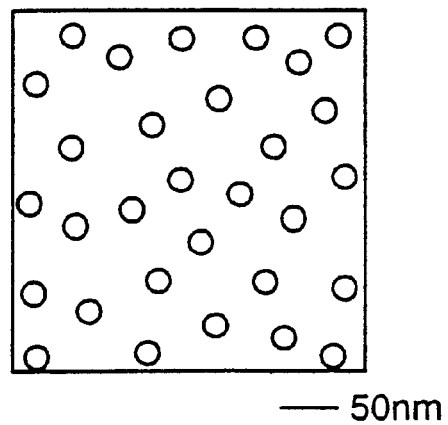

Referring to FIG. 3, the quantum semiconductor memory device of the present invention has a band structure similar to that of FIG. 1, except that self-organized quantum dots Q1–Q3, which are formed spontaneously in a heteroepitaxial system, are used in place of the quantum dot M1. Thereby, the composition of the quantum dots Q1–Q3 is selected such that the quantum level $L_e$ of the electrons in the quantum dots Q1–Q3 are located at a higher energy level as compared with the X-valley of the conduction band of the accumulation layer M3. In view of the difficulty of controlling the size of the self-organized quantum dots Q1–Q3 as explained before, the present invention selects the material of the quantum dots Q1–Q3 from a direct-transition type semiconductor material such that the semiconductor material has a bandgap as large as possible and simultaneously forms a suitable strained system with respect to the substrate. By doing so, the electrons excited optically in the quantum dots Q1–Q3 escape efficiently to the accumulation layer, leaving the holes in the quantum dots Q1–Q3 in a spatially separated state from the optically excited electrons held in the layer M3.

[First Embodiment]

Figure 4:
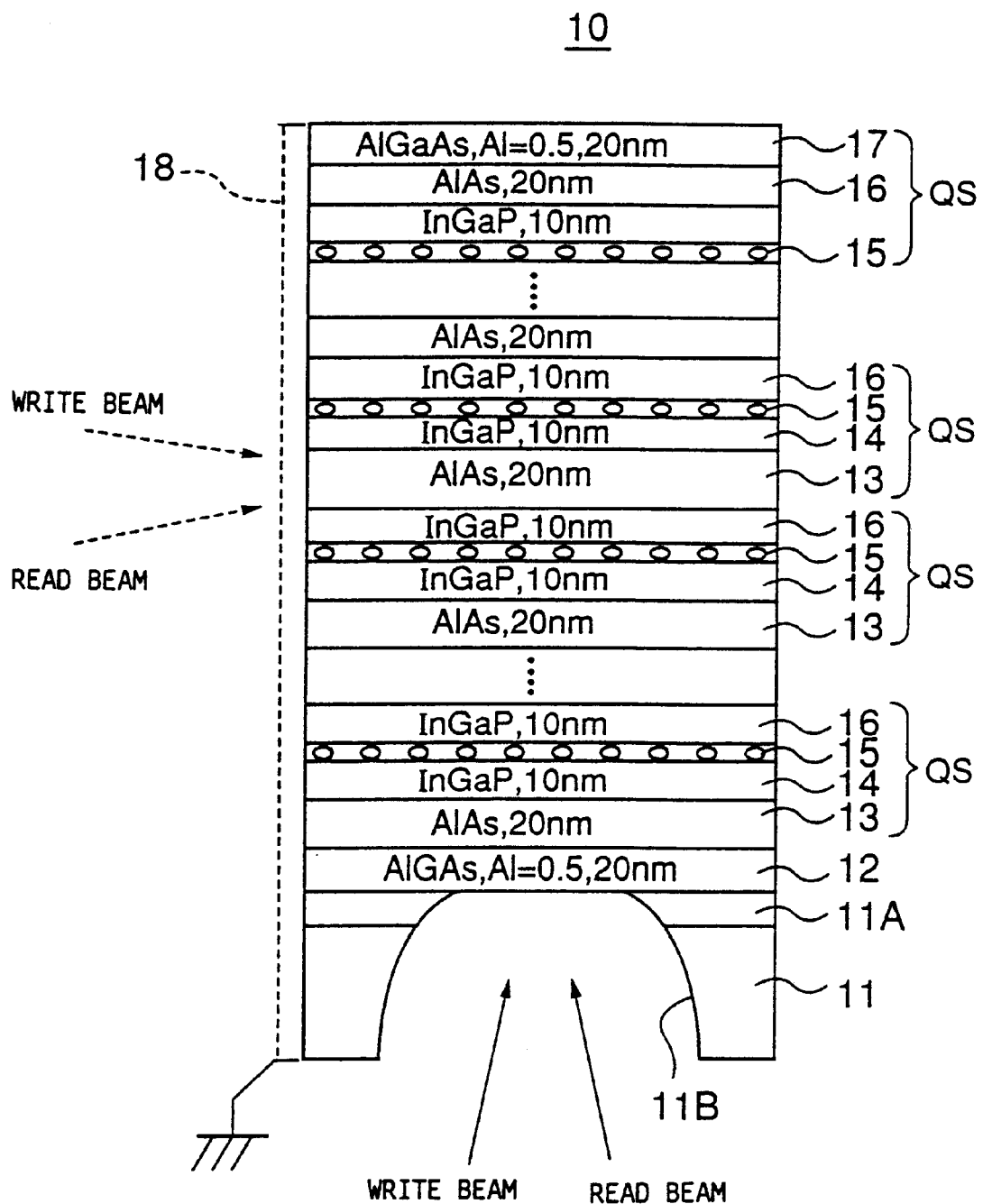
FIG. 4 is a diagram showing the construction of a quantum semiconductor memory device according to a first embodiment of the present invention.

FIG. 4 shows the construction of a wavelength-multiplex quantum semiconductor memory device 10 according to a first embodiment of the present invention.

Referring to FIG. 4, the wavelength-multiplex quantum semiconductor memory device 10 is constructed on a (100) surface of a semi-insulating GaAs substrate 11 and includes a buffer layer 11A of undoped GaAs formed on the GaAs substrate 11 epitaxially with a thickness of 300 nm and an etching stopper layer 12 of undoped AlGaAs having a composition of $Al_{0.5}Ga_{0.5}As$ formed on the buffer layer 11A epitaxially with a thickness of typically 20 nm. On the etching stopper layer 12, there is provided a carrier accumulation layer 13 of undoped AlAs epitaxially with a thickness of about 20 nm, and a barrier layer 14 of InGaP is formed further on the accumulation layer 13 epitaxially with a thickness of about 10 nm. Further, InP quantum dots 15 are formed on the foregoing InGaP barrier layer 14 according to the Stranski-Krastanow growth mode of a strained heteroepitaxial system.

The InP quantum dots 15 are covered by another barrier layer 16 of InGaP, which is formed on the InGaP barrier layer 14 typically with a thickness of 10 nm. Thereby, a quantum structure QS including the accumulation layer 13, the barrier layers 14 and 16 and the intervening quantum dots 15 is obtained on the etching stopper layer 12. The quantum structure QS thus formed is repeatedly stacked on the substrate 11. It should be noted that the barrier layers 12 and 16 have a composition that achieves a lattice matching to the GaAs substrate 11.

Further, a cap layer 17 of undoped AlGaAs is formed on the uppermost quantum structure QS typically with a thickness of about 20 nm. When forming the cap layer 17 from AlGaAs, it is desired that the cap layer 17 has a composition of $Al_{0.5}Ga_{0.5}As$ so as to avoid absorption of the optical beam passing therethrough. On the other hand, it is also possible to form the cap layer 17 from GaAs or AlGaAs containing a small amount of Al, when the thickness of the cap layer 17 is reduced and there is no substantial optical absorption in the cap layer 17.

Further, an opening 11B is formed in the substrate 11 as well as in the buffer layer 11A by a wet etching process as indicated in FIG. 4 so as to expose the bottom surface of the etching stopper layer 12. It should be noted that the quantum dots 15 of FIG. 4 correspond to the quantum dots Q1–Q3 of FIG. 3, the barrier layers 14 and 16 correspond to the barrier layer M2, and the accumulation layers 13 correspond to the accumulation layer M3 of FIG. 3.

As InP constituting the quantum dot 15 forms a strained system with respect to InGaP that forms the underlying barrier layer 12, the InP quantum dots 15 are formed as island regions each having a diameter of several ten nanometers and a height of several nanometers, as a result of the Stranski-Krastanow growth mode. On the other hand, the individual islands or quantum dots 15 of InP thus formed are not subjected to an external control with regard to the exact size thereof. Thus, there is a substantial variation in the size, and hence the quantum levels, of the quantum dots 15 in the structure of FIG. 4.

Figure 5:
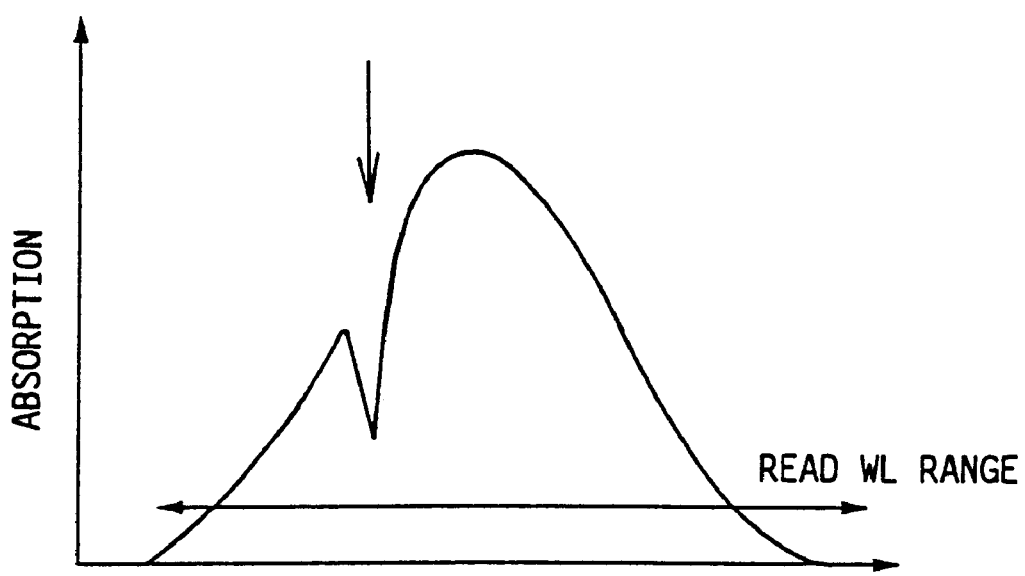
FIG. 5 is a diagram explaining a wavelength multiplexing recording conducted in the quantum semiconductor memory device of FIG. 4.

FIG. 5 shows the overall optical absorption characteristic of the foregoing wavelength-multiplex quantum semiconductor memory device 10 of FIG. 4 caused by the quantum dots 15.

Referring to FIG. 5, it is noted that the optical absorption characteristic of the device 10 shows a broad, diffused spectrum about a central wavelength due to the overlapping of absorption spectra of the quantum dots 15.

Thus, when a write optical beam having a wavelength set to interact with a particular quantum dot 15 is applied to the device 10 through the opening 11B in the substrate 11 from a downward direction as indicated in FIG. 4, there occurs a saturation of optical absorption in the foregoing specific quantum dot 15 as a result of PHB (photo hole burning) effect, and such an optical absorption is observed in the form of a dip in the optical absorption spectrum as indicated in FIG. 5.

As explained already, the electron that is optically excited in the quantum dot escapes to the adjacent accumulation layer 13 after tunneling through the InGaP barrier layer 14 or 16, leaving behind a hole in the optically excited quantum dot. Thereby, the optical absorption of the foregoing quantum dot is saturated. The optically saturated state thus formed is maintained stably due to the spatial separation of the electron and hole thus achieved.

In the foregoing quantum device 10 of FIG. 4 that includes the quantum dots 15, it is desirable to form the InGaP barrier layer 14 or 16 adjacent to the quantum dot 15 to have a thickness of 10 nm or less for facilitating the tunneling of the electrons therethrough. The barrier layer 14 or 16 covering the quantum dot 15 accumulates a strain therein, while the strain thus accumulated in the barrier layer is transferred to the adjacent AlAs accumulation layer 13 and induces a shift of energy of the conduction band X of the AlAs layer 13 in a low energy direction. Thereby, the efficiency of Γ-X transfer of the electron from the quantum dot 15 to the accumulation layer 13 is facilitated further.

When reading information written into the quantum semiconductor memory device 10, a white optical beam, which may be produced by a white optical beam source such as a W (tungsten) lamp, is applied to the stacked quantum structure QS as a read optical beam, with a reduced optical power typically smaller than one-tenth the optical power used for writing information. The read optical beam is applied to the quantum semiconductor memory device 10 through the foregoing opening 11B, and the read optical beam that has passed through the stacked quantum structure QS is detected by a photodetector (not shown) after a spectral analysis by a spectrometer (not shown) disposed above the device 10.

It should be noted that the optical absorption spectrum thus detected includes a dip having a width of 1 nm or less in correspondence to the written information. This means that it is possible to conduct a multiple recording of optical information by changing the wavelength of the optical beam used for writing information variously. Such a change of optical wavelength can be achieved by using a tunable laser such as a titanium sapphire laser.

In the construction of FIG. 4, it should be noted that the quantum level $L_e$ of the InP quantum dot 15 is located at a higher energy side of the X-valley of the AlAs accumulation layer 13 due to the large bandgap of InP used for the quantum dot, contrary to the case of conventional quantum dot of InAs. Thereby, it is not necessary to apply any external electric field for extracting the electron from the quantum dot 15 to the accumulation layer 13, and the construction of the quantum semiconductor memory device 10 is simplified substantially.

When the write optical beam used for writing information has a large intensity, the amount of electrons accumulated in the accumulation layer 13 increases. Thereby, there is a possibility that the accumulated electrons in the layer 13 induce a shift of potential energy of the accumulation layer 13 to a higher energy side. Such an unwanted shift of the energy of the accumulation layer 13 is avoided easily by providing a ground electrode 18 to the side wall of the device 10, such that the accumulated electrons escape to the ground through the electrode 18.

In the construction of FIG. 4, the optical path of the write optical beam or read optical beam is by no means limited to the one that passes through the opening 11B, but it is also possible to apply the write optical beam or read optical beam to the side wall of the layered semiconductor body forming the quantum semiconductor device 10 as indicated in FIG. 4 by broken arrows.

[Second Embodiment]

Figure 6:
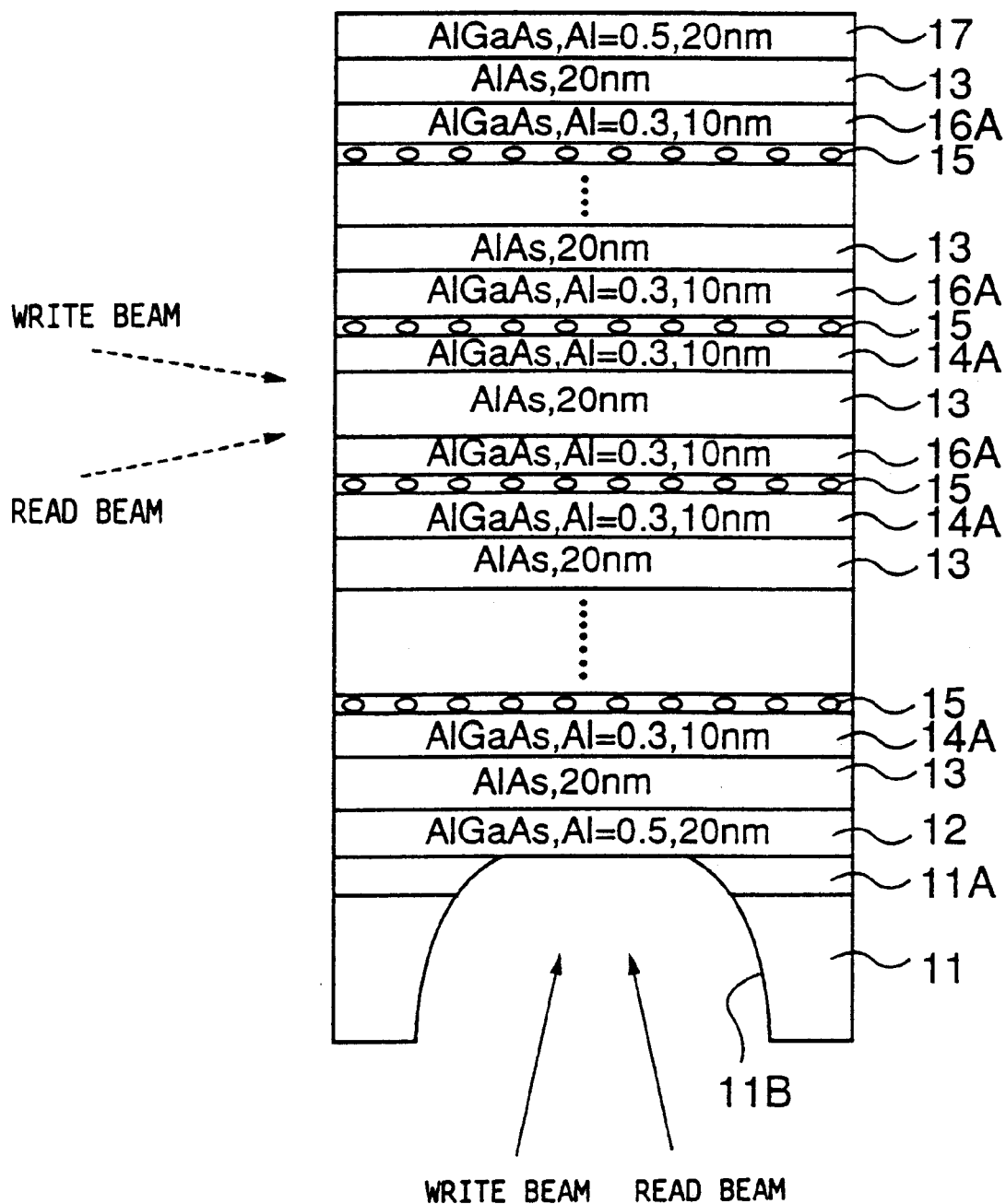
FIG. 6 is a diagram showing the construction of a quantum semiconductor memory device according to a second embodiment of the present invention.

FIG. 6 shows the construction of a wavelength-multiplex quantum semiconductor memory device 20 according to a second embodiment of the present invention, wherein those parts corresponding to the parts described previously are designated by the same reference numerals and the description thereof will be omitted.

Referring to FIG. 6, the quantum semiconductor memory device 20 has a construction similar to that of the quantum semiconductor memory device 10, except that barrier layers 14A and 16A each having a composition of $Al_{0.3}Ga_{0.7}As$ and a thickness of about 10 nm, are used in place of the InGaP barrier layers 14 and 16 of FIG. 4.

In the present embodiment, too, the barrier layers 14A and 16A achieve a lattice matching to the substrate 11 and forms a strained heteroepitaxial system with respect to the InP quantum dot 15. When the barrier layer contacting the InP quantum dot 15 contains As as in the case of the barrier layer 14A or 16A of the present embodiment, there is a tendency that As in the barrier layer causes a diffusion into the quantum dot 15 and the composition of the quantum dot 15 changes from InP to InAsP. Even in such a case, the amount of As incorporated into the quantum dot 15 is small, and the Γ-X transfer of the optically excited electron from the quantum level $L_e$ to the X-valley of the AlAs accumulation layer 13 proceeds efficiently.

As other features of the present embodiment are substantially identical with those described already in the preceding embodiment, further description thereof will be omitted.

[Third Embodiment]

Figure 7:
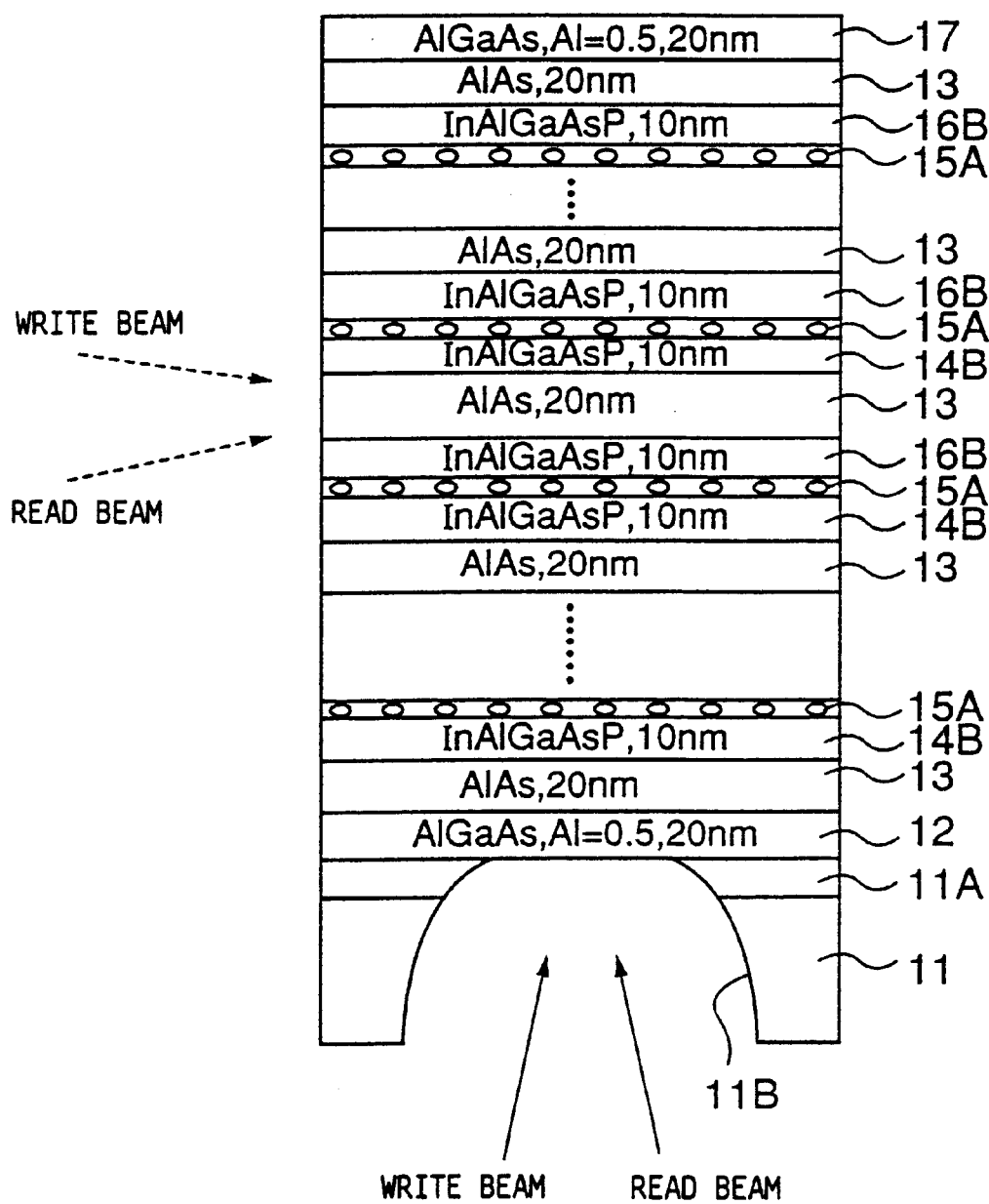
FIG. 7 is a diagram showing the construction of a quantum semiconductor memory device according to a third embodiment of the present invention.

FIG. 7 shows the construction of a wavelength-multiplex quantum semiconductor memory device 30 according to a third embodiment of the present invention. In FIG. 7, those parts corresponding to the parts described previously are designated by the same reference numerals and the description thereof will be omitted.

Referring to FIG. 7, the quantum semiconductor memory device 30 has a construction similar to that of the quantum semiconductor memory device 10 of FIG. 6, except that the barrier layers 14 and 16 of InGaP of FIG. 4 are now replaced by barrier layers 14B and 16B of undoped InAlGaAsP having a thickness of 10 nm, with a composition set so as to achieve a lattice matching to the substrate 11. In correspondence to the use of the InAlGaAsP barrier layers 14B and 16B, the present embodiment uses a quantum dot 15A of InAsP in place of the InP quantum dot 15.

In the present embodiment, too, the barrier layers 14B and 16B form a strained heteroepitaxial system with respect to InAsP forming the quantum dot 15A.

As other features of the present embodiment are substantially identical with those described already, further description thereof will be omitted.

[Fourth Embodiment]

Figure 8:
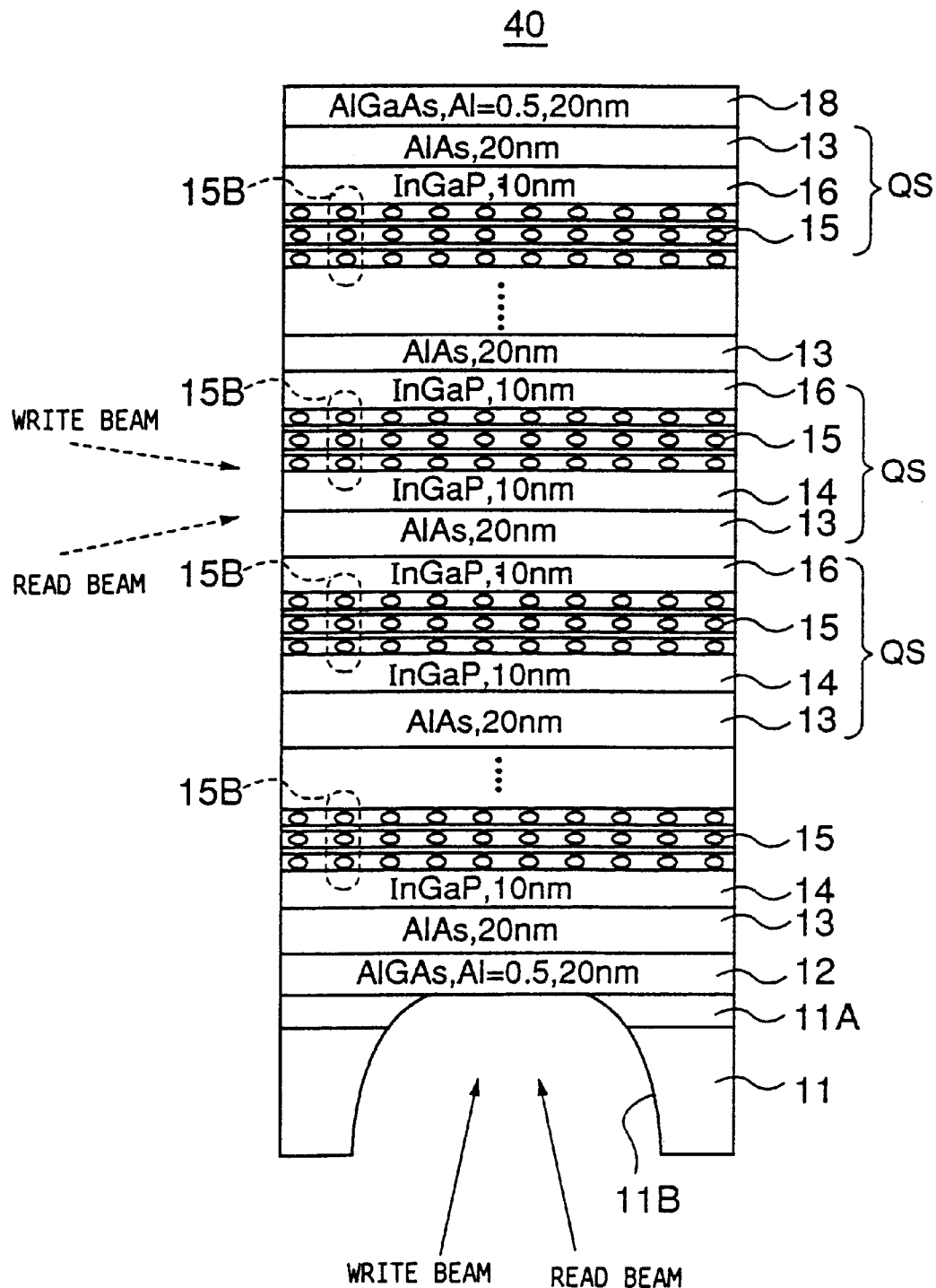
FIG. 8 is a diagram showing the construction of a quantum semiconductor memory device according to a fourth embodiment of the present invention.

FIG. 8 shows the construction of a wavelength-multiplex quantum semiconductor memory device 40 according to a fourth embodiment of the present invention, wherein those parts corresponding to the parts described previously are designated by the same reference numerals and the description thereof will be omitted.

Referring to FIG. 8, the quantum semiconductor memory device 40 has a construction similarly to the construction of the quantum semiconductor memory device 10 of FIG. 4, except that the InP quantum dot 15 is repeated a plurality of times in each quantum structure QS, together with corresponding barrier layers and the accumulation layer. The quantum dots 15 thus stacked repeatedly show a spontaneous alignment in the direction generally perpendicular to the principal surface of the substrate 11 and form an effectively single large quantum dot 15B by causing a quantum mechanical coupling with each other.

Such a spontaneous alignment of the Stranski-Krastanow mode quantum dots is described in Sugiyama, et al. (Sugiyama, Y. et al., Jpn. J. Appl. Phys., 35, Part 1, No.2B, pp.365–369, February, 1996). In brief, it is believed that the quantum dot 15 of InP induces a localized deformation in the crystal lattice of the InGaP barrier layer covering the quantum dot 15 in correspondence to the part located immediately above the quantum dot 15 due to the lattice misfit between the InP quantum dot and the InGaP barrier layer 16, and the Stranski-Krastanow growth mode of the quantum dot 15 occurs preferentially on such a deformed region of the barrier layer 16.

As noted already, the vertically aligned quantum dots 15 are coupled to each other quantum mechanically to form the large, effectively single quantum dot 15B, wherein it should be noted that the variation in size of the quantum dot 15B is reduced substantially as compared with the case of forming the quantum dots 15 in separate layers. The construction of FIG. 8 enables an intentional control of the optical absorption spectrum by changing the number of stacks of the quantum dots 15 in the quantum structures QS.

As other features of the present embodiment are substantially identical with those described already, further description thereof will be omitted.

[Fifth Embodiment]

Figure 9:
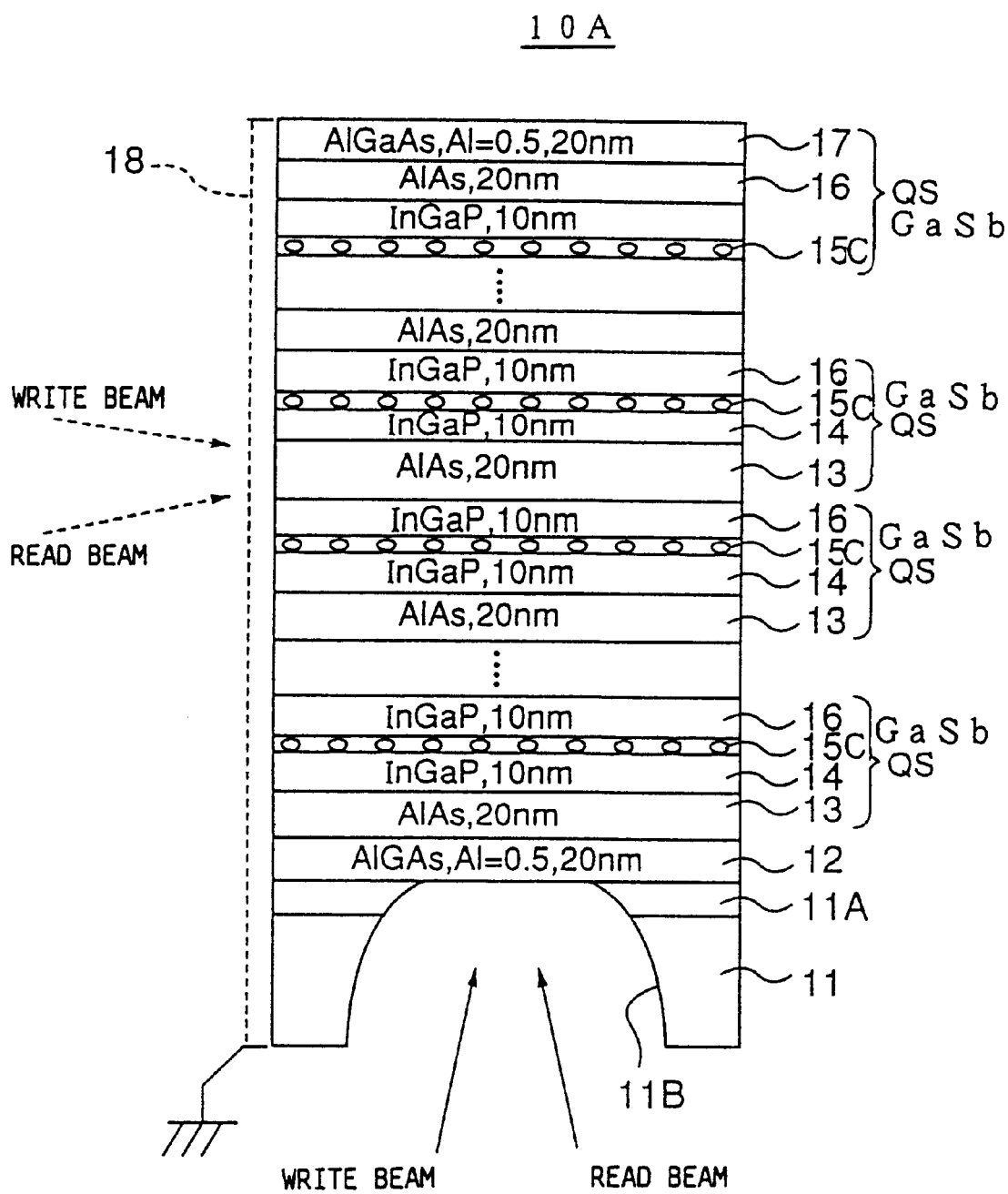
FIG. 9 is a diagram showing the construction of a quantum semiconductor memory device according to a fifth embodiment of the present invention.

FIG. 9 shows the construction of a quantum semiconductor memory device 10A according to a fifth embodiment of the present invention, wherein those parts corresponding to the parts described previously are designated by the same reference numerals and the description thereof will be omitted.

Referring to FIG. 9, the quantum semiconductor memory device 10A has a construction generally identical with that of the quantum semiconductor memory device 10 of FIG. 4, except that a quantum dot 15C of undoped GaSb is formed by the S-K mode growth similarly to the quantum dot 15.

In the present embodiment, too, a band structure similar to the band structure of FIG. 3 is obtained, wherein it is noted that the conduction band and the valence band of the GaSb quantum dot 15C, and hence the ground quantum levels $L_e$ and $L_h$ of electrons and holes therein, are collectively shifted in the higher energy side with respect to the adjacent InGaP barrier layer. Thereby, the depth of the potential well confining holes in the quantum dot 15C is increased. Further, it is noted that the ground level $L_e$ of the electrons is shifted in the higher energy side of the X-valley of the accumulation layer 16. Thereby, the efficiency of escape of the optically excited electrons from the quantum dot 15C to the adjacent electron accumulation layer 16 by the X-Γ transfer mechanism is substantially facilitated.

Other aspects of the present embodiment are similar to those described previously and the description thereof will be omitted.

[Sixth Embodiment]

Figure 10:
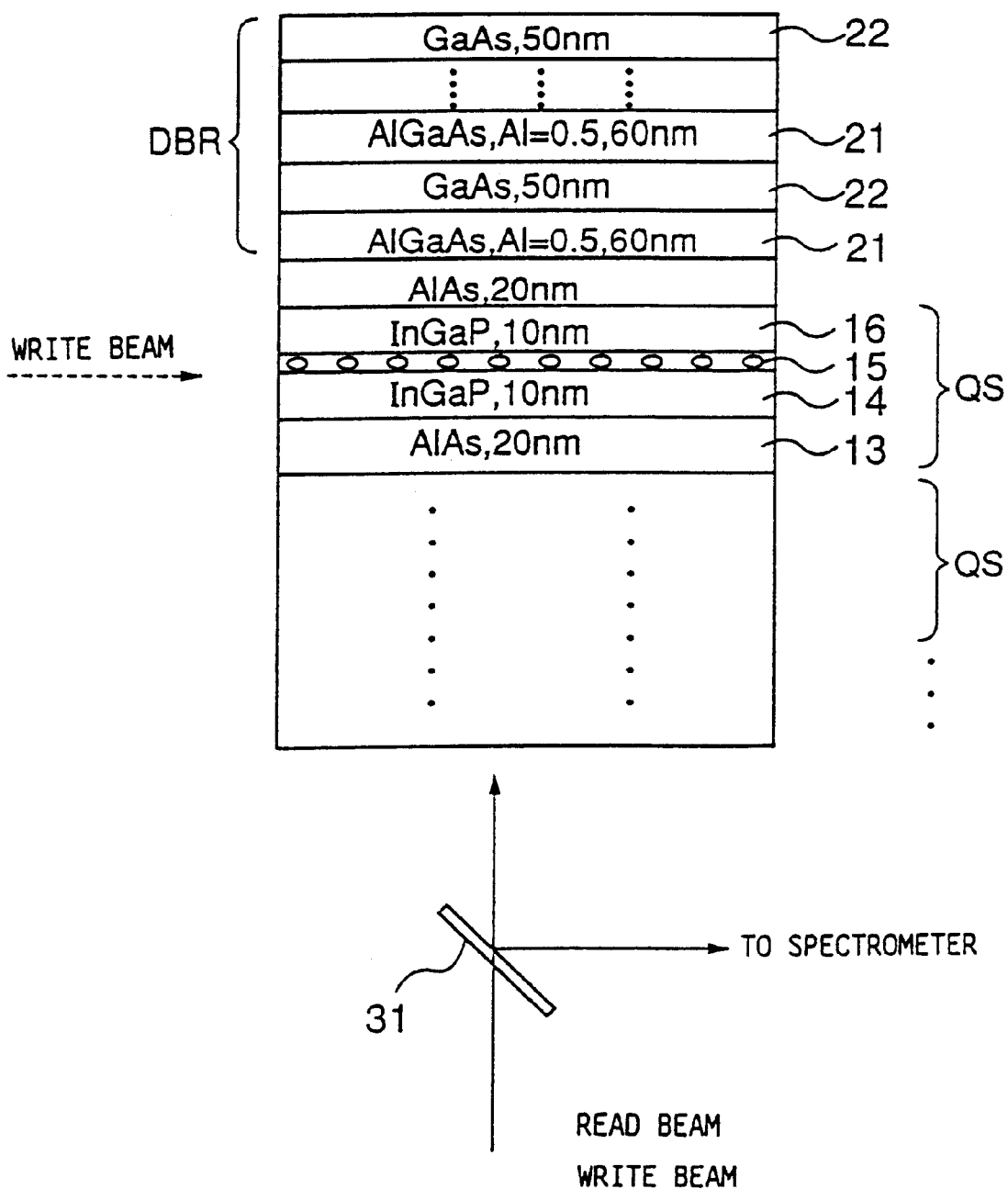
FIG. 10 is a diagram showing the construction of a quantum semiconductor memory device according to a sixth embodiment of the present invention.

FIG. 10 shows the construction of a wavelength-multiplex quantum semiconductor memory device 50 according to a sixth embodiment of the present invention, wherein those parts corresponding to the parts described previously are designated by the same reference numerals and the description thereof will be omitted. In FIG. 10, the illustration of the substrate 11 and the buffer layer 11A thereon is omitted.

Referring to FIG. 10, the present embodiment includes, on a layered semiconductor body that includes a stacking of the quantum structures QS of FIG. 4, a Bragg reflector (DBR) formed of an alternate repetition of an AlGaAs layer 21 having a thickness of 60 nm and a composition of $Al_{0.5}Ga_{0.5}As$ and a GaAs layer 22 having a thickness of 50 nm.

In the construction of FIG. 10, there is provided a semitransparent mirror 31 underneath the foregoing layered semiconductor body, and a white read optical beam produced by a white beam source (not shown) is directed to the quantum structures QS in the layered semiconductor body through the foregoing semitransparent mirror 31. The read optical beam travels through the stacked quantum structures QS and reflected back by the DBR to the semitransparent mirror 31, wherein the semitransparent mirror 31 reflects the reflected read beam to a spectrometer not illustrated.

When writing information, a strong monochromatic optical beam is directed to the quantum structures QS through the semitransparent mirror 31 as a write optical beam. Alternatively, the write optical beam may be directed to the side wall of the layered semiconductor body as indicated by a broken arrow in FIG. 10.

[Seventh Embodiment]

Figure 11:
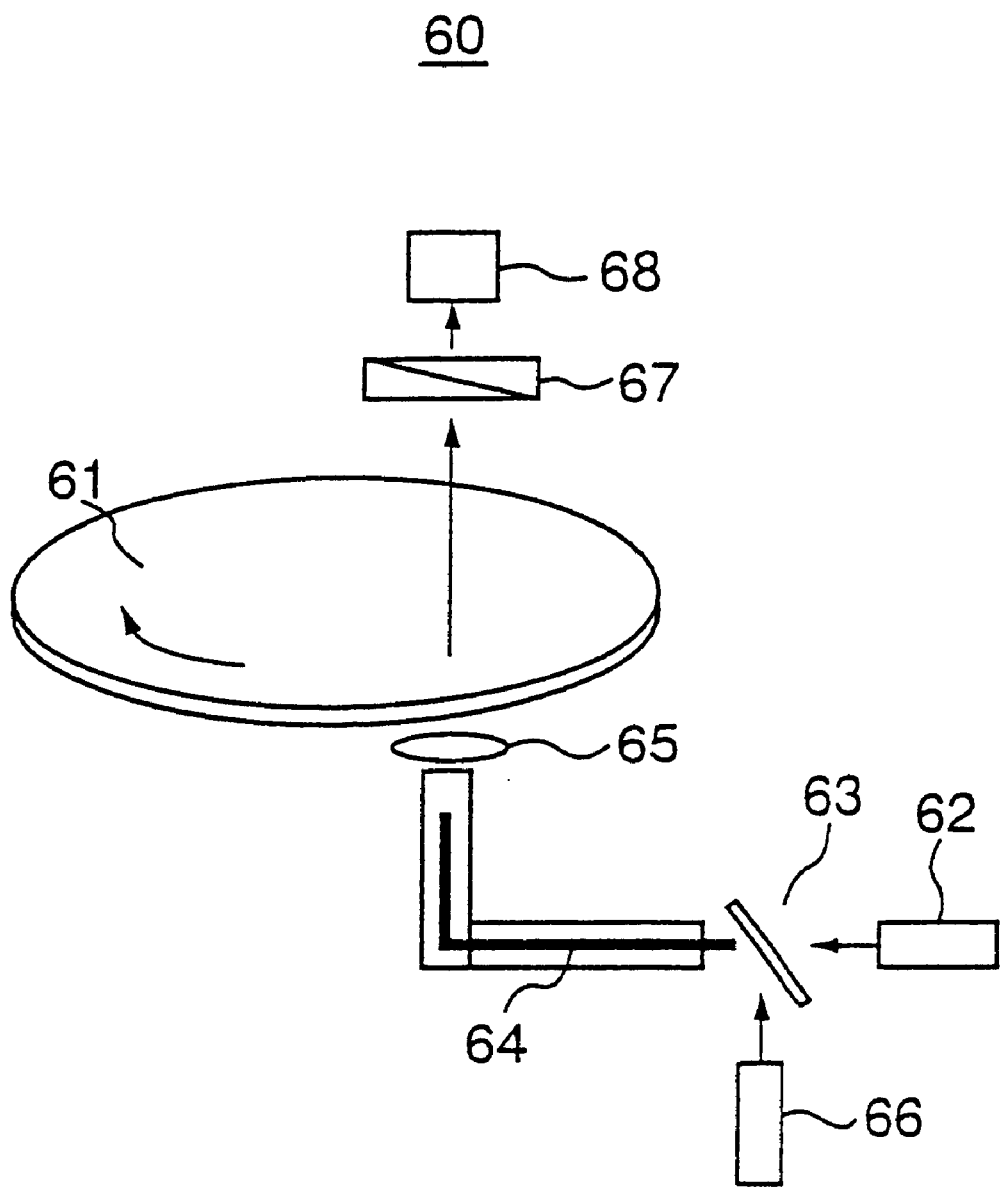
FIG. 11 is a diagram showing the construction of an information recording and reproducing apparatus that uses a quantum semiconductor memory device according to a seventh embodiment of the present invention.

FIG. 11 shows the construction of an optical multiplex recording and reproducing apparatus 60 according to a sixth embodiment of the present invention.

Referring to FIG. 11, the optical multiplex recording apparatus 60 includes a rotary recording disk 61 formed of any of the wavelength multiplex quantum semiconductor memory devices 10–50 shaped into a disk-form, wherein the rotary recording disk 61 is driven about a central axis thereof by a drive mechanism not illustrated. Further, there is provided a tunable laser 62 adjacent to the disk 61 such that the tunable laser 62 supplies an optical output beam to the disk 61 via a semitransparent mirror 63 and an optical fiber 64 as a write optical beam. The write optical beam is then focused upon the rotary recording disk 61 by a lens 65 and induces an optical excitation of a quantum dot. By changing the wavelength of the tunable laser 62, a wavelength-multiplex recording of information is achieved on the recording disk 61.

The system of FIG. 11 further includes a white beam source 66 that produces a white output beam as a read optical beam, wherein the read optical beam thus produced is directed to the recording disk 61 via the semitransparent mirror 63 and the optical fiber 64 and focused thereto by the lens 65. Further, there is provided a spectrometer 67 and a photodetector 68 at the other side of the recording disk 61 for detecting the spectrum of the read optical beam passed through the disk 61. The spectrometer 68 and the detector 68 may form a part of an optical head together with the foregoing lens 65 and the optical fiber 64, wherein the optical head is moved in a radial direction of the recording disk 61.

[Eighth Embodiment]

FIG. 12 shows the construction of an optical multiplex recording and reproducing apparatus 70 according to an eighth embodiment of the present invention, wherein those parts corresponding to the parts described previously with reference to FIG. 12 will be designated by the same reference numerals and the description thereof will be omitted.

Figure 12:
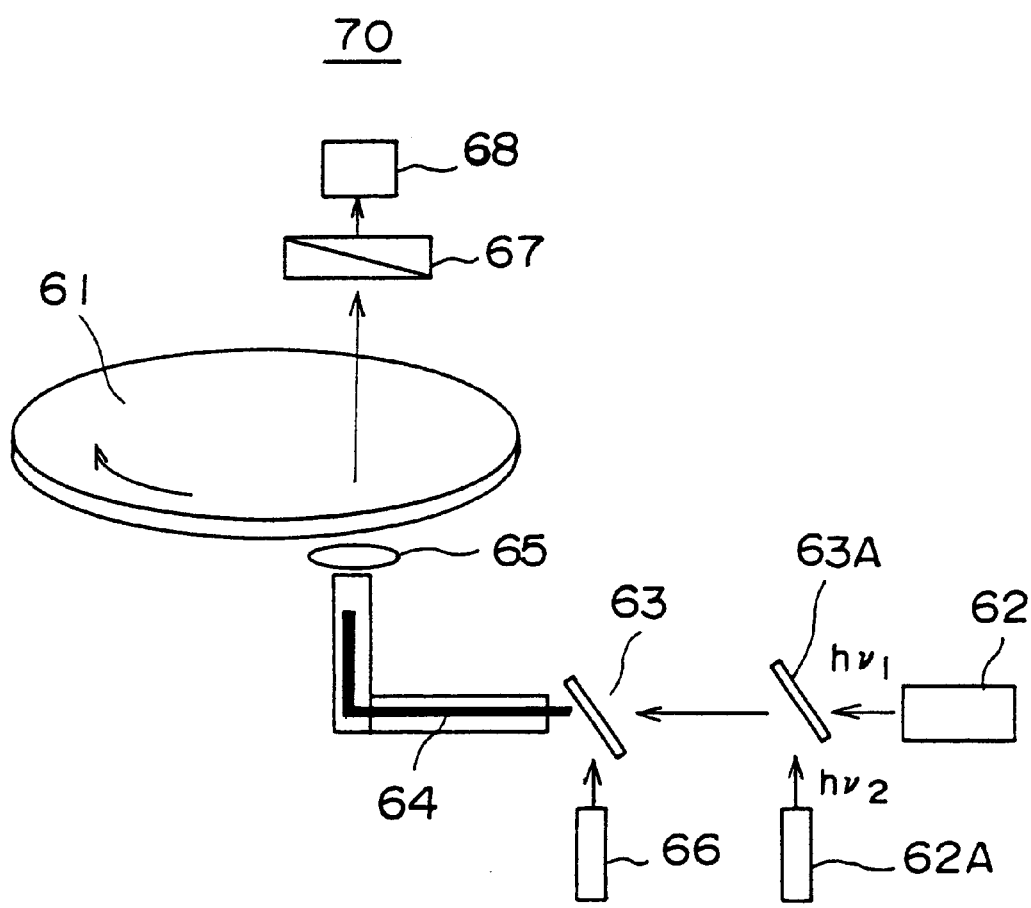
FIG. 12 is a diagram showing the construction of an information recording and reproducing apparatus that uses a quantum semiconductor memory device according to an eighth embodiment of the present invention.

Referring to FIG. 12, the optical recording and reproducing apparatus 70 includes, in addition to the laser 62 that now produces a first optical beam with a first wavelength $v_1$ for writing, another laser 62A that produces another optical beam with a second wavelength $v_2$, wherein the first and second optical beams are injected into the optical fiber 64 via another semitransparent mirror 63A and the semitransparent mirror 63 noted before.

Figure 13:
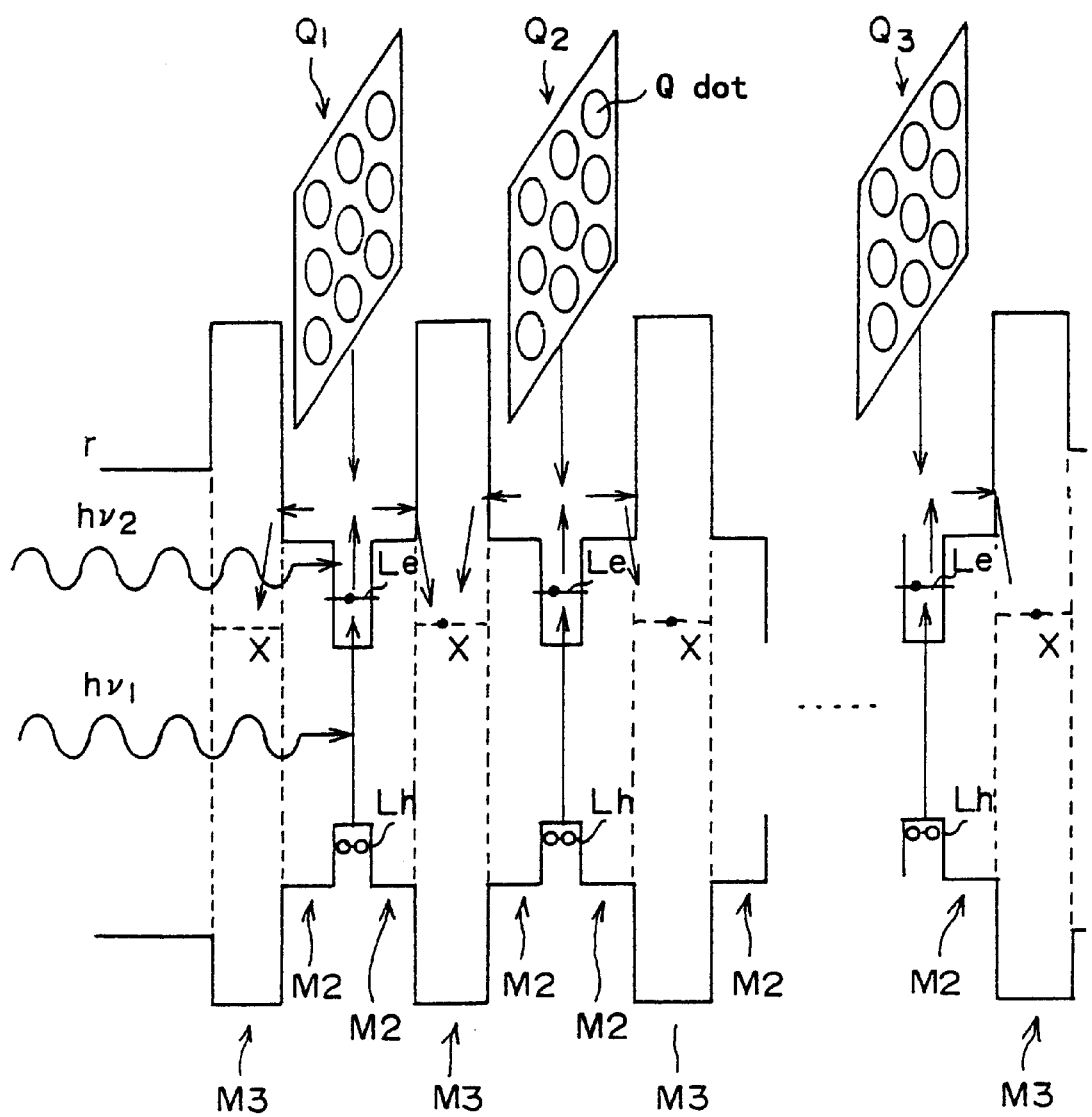
FIG. 13 is a band diagram of the quantum semiconductor memory device used in the embodiment of FIG. 12.

FIG. 13 shows the band structure of the recording disk 61.

Referring to FIG. 13, it will be noted that the first wavelength $v_1$ is set so as to cause a substantial resonance with the ground quantum levels $L_e$ and $L_h$ of the quantum dots Q1–Q3 corresponding to the foregoing quantum dot 15 or 15A, and the electrons are excited, in each of the quantum dots Q1–Q3, from the quantum level $L_h$ in the valence band to the quantum level $L_e$ in the conduction band. Thus, by setting the wavelength $v_2$ such that the electrons in the ground quantum level $L_e$ can override the barrier layer M2 corresponding to the foregoing barrier layer 14 or 16, the electrons excited to the quantum level $L_e$ are efficiently transferred to the X-valley of the accumulation layer M3 by activating the first and second lasers 62 and 62A simultaneously. Thereby, an efficient writing of information becomes possible.

Figure 14:
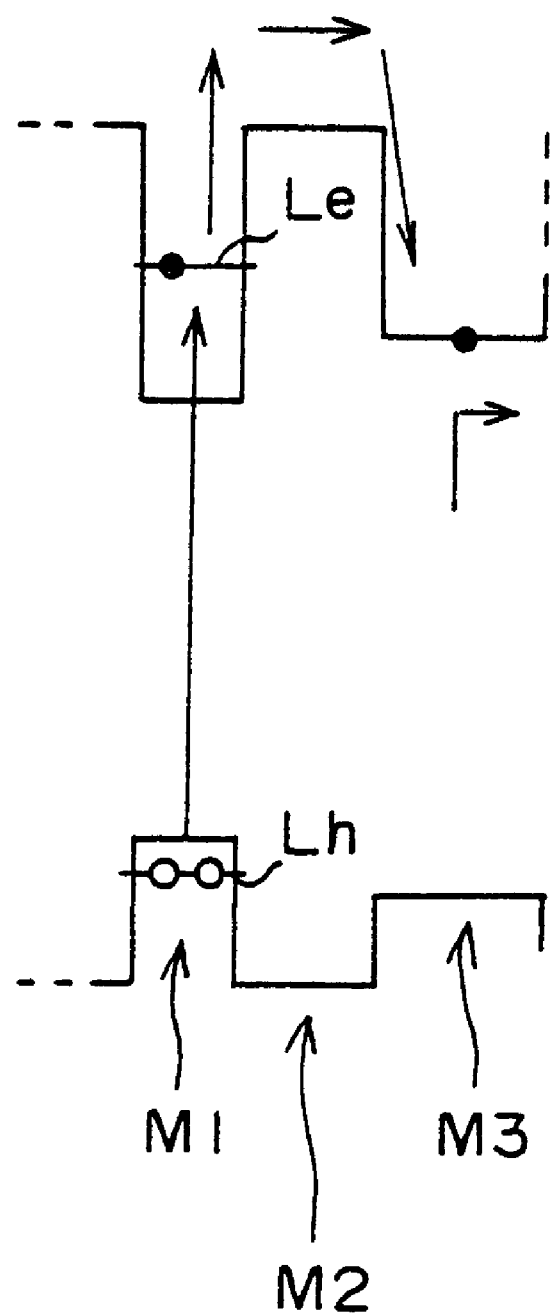
FIG. 14 is a band diagram showing a modification of the band diagram of FIG. 13.

Further, it should be noted that the construction of FIG. 12 allows the use of a direct-transition type semiconductor material such as AlGaAs for the accumulation layer M3 as indicated in FIG. 14.

Referring to FIG. 14, it should be noted that the electrons are excited, in each of the quantum dots Q1–Q3, to the energy level sufficient to override the potential barrier of the adjacent barrier layer M2 by the second optical beam. Thus, by setting the bandgap of the accumulation layer M3 to be slightly smaller than the bandgap of the barrier layer M2, it becomes possible to accumulate the optically excited electrons in the Γ-valley of the accumulation layer M3. The band structure of FIG. 14 is realized for example by using AlGaAs for the barrier layer M2 and the accumulation layer M3 while simultaneously setting the compositions $Al_xGa_{1-x}As$ of the layers M2 and M3 such that the bandgap increases in the barrier layer M2 and reduces in the accumulation layer M3.

Figure 15:
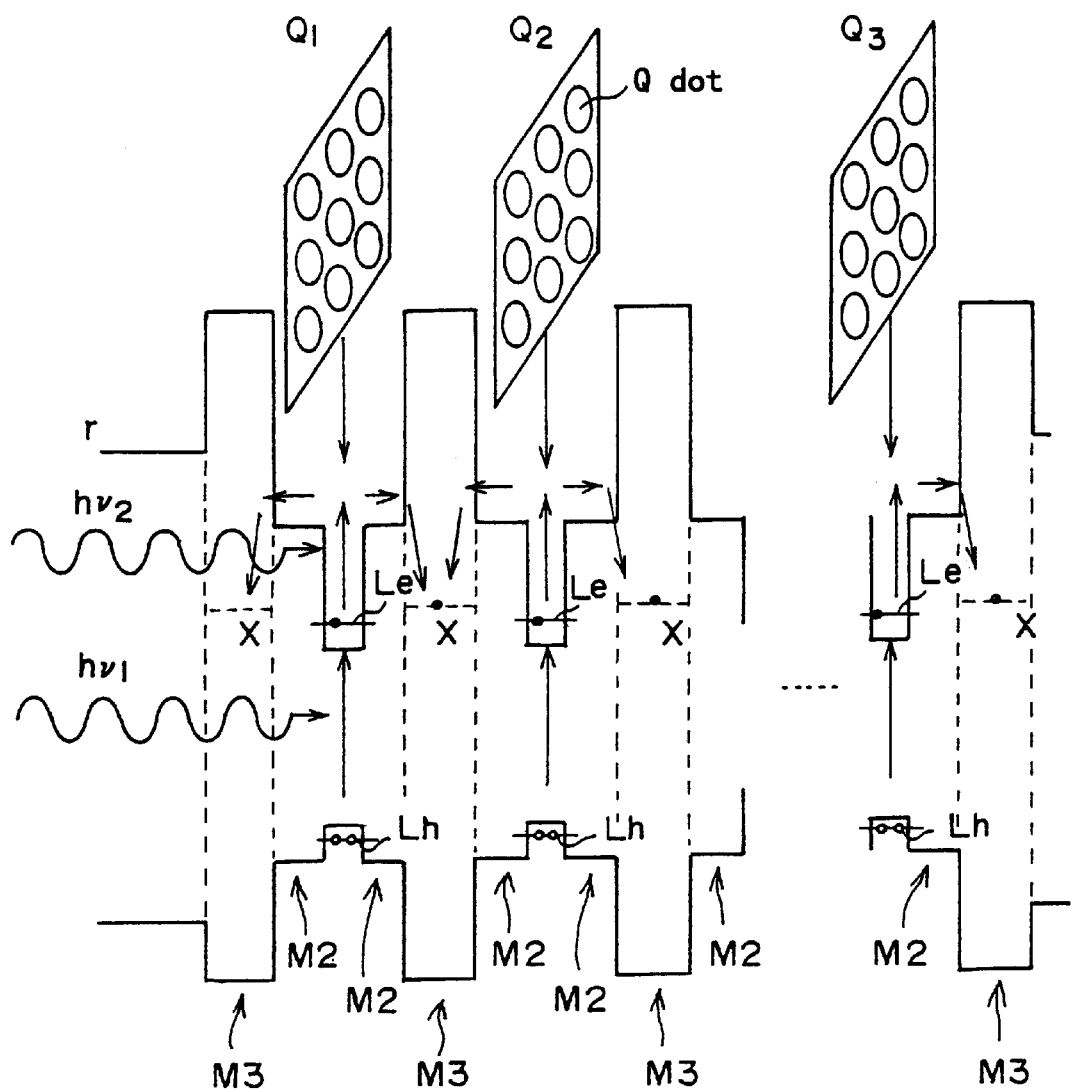
FIG. 15 is a band diagram showing a further modification of the band diagram of FIG. 13.

Further, it should be noted that the construction of FIG. 12 is effective also in the case of the band structure of FIG. 15 for the quantum dots Q1–Q3, in which the ground quantum level $L_e$ of electrons is lower than the X-valley of the accumulation layer M3. Even in such a case, the electrons that have overridden the barrier layer M2 are collected at the X-valley of the adjacent accumulation layer M3 and the optical writing of information into the recording disk 61 becomes possible.

Further, the present invention is by no means limited to the foregoing embodiments but various variations and modifications may be made without departing from the scope of the invention.

What is claimed is:

1. A quantum semiconductor device, comprising:
   a semiconductor substrate;
   an undoped active layer formed on said semiconductor substrate, said active layer including a quantum structure; and
   an accumulation layer provided on said semiconductor substrate adjacent to said active layer, said quantum structure including:
   an undoped barrier layer of a first semiconductor crystal having a first lattice constant and a first bandgap; and
   a plurality of self-organized quantum dots each formed of a second semiconductor crystal having a second lattice constant different from said first lattice constant and a second bandgap smaller than said first bandgap, said second semiconductor crystal forming a strained heteroepitaxial system to said first semiconductor crystal, said plurality of self-organized quantum dots having respective quantum levels, and said second semiconductor crystal having a composition set such that said quantum level of said self-organized quantum dots are located higher than a conduction band edge of said accumulation layer.

2. A quantum semiconductor memory device as claimed in claim 1, wherein said accumulation layer is formed of an indirect-transition type semiconductor material having a X-valley of a conduction band at an energy level low than said quantum level.

3. A quantum semiconductor memory device as claimed in claim 1, wherein said barrier layer has a thickness allowing a tunneling of a carrier therethrough.

4. A quantum semiconductor memory device as claimed in claim 1, wherein said first semiconductor crystal has a composition that achieves a lattice matching to said substrate.

5. A quantum semiconductor memory device as claimed in claim 1, wherein said active layer and said accumulation layer are repeated alternately a plurality of times to form a layered semiconductor body.

6. A quantum semiconductor memory device as claimed in claim 5, wherein said layered semiconductor body carries, on a side surface thereof, an ohmic ground electrode.

7. A quantum semiconductor memory device as claimed in claim 1, wherein said barrier layer and said quantum dot are repeated alternately a plurality of times in said quantum structure, and wherein each said quantum dot is aligned with an adjacent quantum dot across an intervening barrier layer in a direction substantially perpendicular to a principal surface of said substrate.

8. A quantum semiconductor memory device as claimed in claim 1, wherein said second semiconductor crystal is InP.

9. A quantum semiconductor memory device as claimed in claim 8, wherein said first semiconductor crystal is selected from a group consisting of InGaP, AlGaAs and AlGaAsP.

10. A quantum semiconductor memory device as claimed in claim 1, wherein said second semiconductor crystal is InAsP and said first semiconductor crystal is AlGaAsP.

11. A quantum semiconductor memory device as claimed in claim 1, wherein said second semiconductor crystal is GaSb.

12. A quantum semiconductor memory device as claimed in claim 11, wherein said first semiconductor crystal is InAsP.

13. A quantum semiconductor device as claimed in claim 1, further comprising: a first optical source emitting a first optical beam with a first wavelength set so as to cause a resonant excitation of an electron in said quantum dot from a ground quantum level for holes to a ground quantum level for electrons; and a second optical source emitting a second optical beam with a second wavelength set so as to excite an electron in said ground quantum level for electrons to an energy level exceeding a top edge of a conduction band of said barrier layer.

14. A quantum semiconductor device as claimed in claim 1, wherein said accumulation layer is formed of an indirect-transition type semiconductor material having a Γ-valley in a conduction band thereof at a level above said ground quantum level for electrons.

15. A quantum semiconductor device as claimed in claim 14, wherein said accumulation layer is formed of AlGaAs.

16. A quantum semiconductor memory device, comprising:
    a semiconductor substrate;
    an active layer formed on said semiconductor substrate, said active layer including a quantum structure;
    an accumulation layer provided on said semiconductor substrate adjacent to said active layer, said quantum structure including:
    a barrier layer of a first semiconductor crystal having a first lattice constant and a first bandgap; and
    a plurality of self-organized quantum dots each formed of a second semiconductor crystal having a second lattice constant different from said first lattice constant and a second bandgap smaller than said first bandgap, said second semiconductor crystal forming a strained heteroepitaxial system to said first semiconductor crystal, said plurality of self-organized quantum dots having respective quantum levels;
    a first optical source emitting a first optical beam with a first wavelength set so as to cause a resonant excitation of an electron in said self-organized quantum dot from a ground quantum level for holes to a ground quantum level for electrons; and
    a second optical source for emitting a second optical beam with a second wavelength set so as to excite an electron in said ground quantum level for electrons to an energy level exceeding a bottom edge of a conduction band of said barrier layer.

17. A quantum semiconductor device as claimed in claim 16, wherein said second semiconductor crystal has a composition set such that a quantum level of electrons in said quantum dot is located equal to or lower than an energy level of a conduction band of said accumulation layer.

18. A quantum semiconductor device as claimed in claim 17, wherein said accumulation layer is formed of an indirect-transition type semiconductor material having an X-valley in said conduction band thereof at an energy level higher than said quantum level for electrons.

19. A quantum semiconductor device as claimed in claim 16, wherein said accumulation layer is formed of an indirect-transition type semiconductor material having an X-valley in a conduction band thereof at a n energy level lower than said quantum level for electrons.

20. A quantum semiconductor device as claimed in claim 19, wherein said second semiconductor crystal has a composition set such that said quantum level for electrons therein is located at a level exceeding a level of said conduction band of said accumulation layer.

* * * * *